United States Patent [19]
Eitan

[11] Patent Number: 6,030,871
[45] Date of Patent: Feb. 29, 2000

[54] PROCESS FOR PRODUCING TWO BIT ROM CELL UTILIZING ANGLED IMPLANT

[75] Inventor: Boaz Eitan, Ra'anana, Israel

[73] Assignee: Saifun Semiconductors Ltd., Netanya, Israel

[21] Appl. No.: 09/072,462

[22] Filed: May 5, 1998

[51] Int. Cl.[7] .............................................. H01L 21/8236
[52] U.S. Cl. ........................ 438/276; 438/275; 438/276; 438/291; 438/525
[58] Field of Search .................................. 438/275, 276, 438/291, 525

[56] References Cited

U.S. PATENT DOCUMENTS

| | | |
|---|---|---|
| 4,173,766 | 11/1979 | Hayes . |
| 4,173,791 | 11/1979 | Bell . |
| 4,527,257 | 7/1985 | Cricchi . |
| 4,630,085 | 12/1986 | Koyama . |
| 4,847,808 | 7/1989 | Kobatake . |
| 5,021,999 | 6/1991 | Kohda et al. . |
| 5,168,334 | 12/1992 | Mitchell et al. . |
| 5,204,835 | 4/1993 | Eitan . |
| 5,214,303 | 5/1993 | Aoki . |
| 5,349,221 | 9/1994 | Shimoji . |
| 5,359,554 | 10/1994 | Odake et al. . |
| 5,412,601 | 5/1995 | Sawada et al. . |
| 5,414,693 | 5/1995 | Ma et al. . |
| 5,418,743 | 5/1995 | Tomioka et al. . |
| 5,424,978 | 6/1995 | Wada et al. . |
| 5,426,605 | 6/1995 | Van Berkel et al. . |
| 5,434,825 | 7/1995 | Harari . |
| 5,768,192 | 6/1998 | Eitan . |
| 5,825,686 | 10/1998 | Schmitt-Lansiedel et al. . |

FOREIGN PATENT DOCUMENTS 2 157 489   10/1995   United Kingdom .

OTHER PUBLICATIONS

T.Y. Chan et al.; "A True Single–Transistor Oxide–Nitride–Oxide EEPROM Device"; IEEE Electron Device Letters, vol. Edl–8, No. 3, Mar. 1987 pp. 93–95.

Eitan et al.; "Hot–Electron Injection into the Oxide in n–channel MOS Devices"; IEEE Transactions on Electron Devices, vol. ED–38, No. 3, Mar. 1981 328–340.

Lance A. Glasser et al., *The Design and Analysis of VLSI Circuits*, Addison–Wesley Publishing Company, Jul. 1988, Chapter 2., pp. 67–163.

Primary Examiner—John F. Niebling
Assistant Examiner—Jennifer M. Kennedy
Attorney, Agent, or Firm—Darby & Darby

[57] ABSTRACT

A dual bit read only memory cell has two bits separately stored in two different areas of the channel, such as the left and right bit line junctions of the channel. A programmed bit has a threshold pocket implant self-aligned to its bit line junction and an unprogrammed bit has no such implant. An array of such cells is manufactured by laying down a bit line mask and separately programming the two bit line junctions. For each bit line junction, the bit line junctions which are to remain unprogrammed are first covered, with a junction mask, after which the array is exposed to a threshold pocket implant at a 15–45° angle, to the right or to the left. The junction mask is removed and the process repeated for the other bit line junction. Finally, the bit line mask is removed. In an alternative embodiment, the threshold pocket implant is two implants, of two different materials.

10 Claims, 9 Drawing Sheets

PROCESS FOR PRODUCING TWO BIT ROM CELL UTILIZING ANGLED IMPLANT

FIELD OF THE INVENTION

The present invention relates to dual bit cells generally and to dual bit mask programmable array cells and their methods of manufacture in particular.

BACKGROUND OF THE INVENTION

Dual bit cells are known in the art although they are not common. Some dual bit cells have multiple threshold levels, where every two threshold levels together store a different bit. Others store one bit on either side of the cell. A dual bit cell of the latter kind, known as nitride read only memory (NROM) cell, is described in Applicant's copending U.S. patent application, Ser. No. 08/905,286, entitled "Two Bit Non-Volatile Electrically Erasable And Programmable Semiconductor Memory Cell Utilizing Asymmetrical Charge Trapping" which was filed Aug. 1, 1997 and was assigned to the common assignee of the present invention. The disclosure of the above-identified application is incorporated herein by reference.

Figure 1:
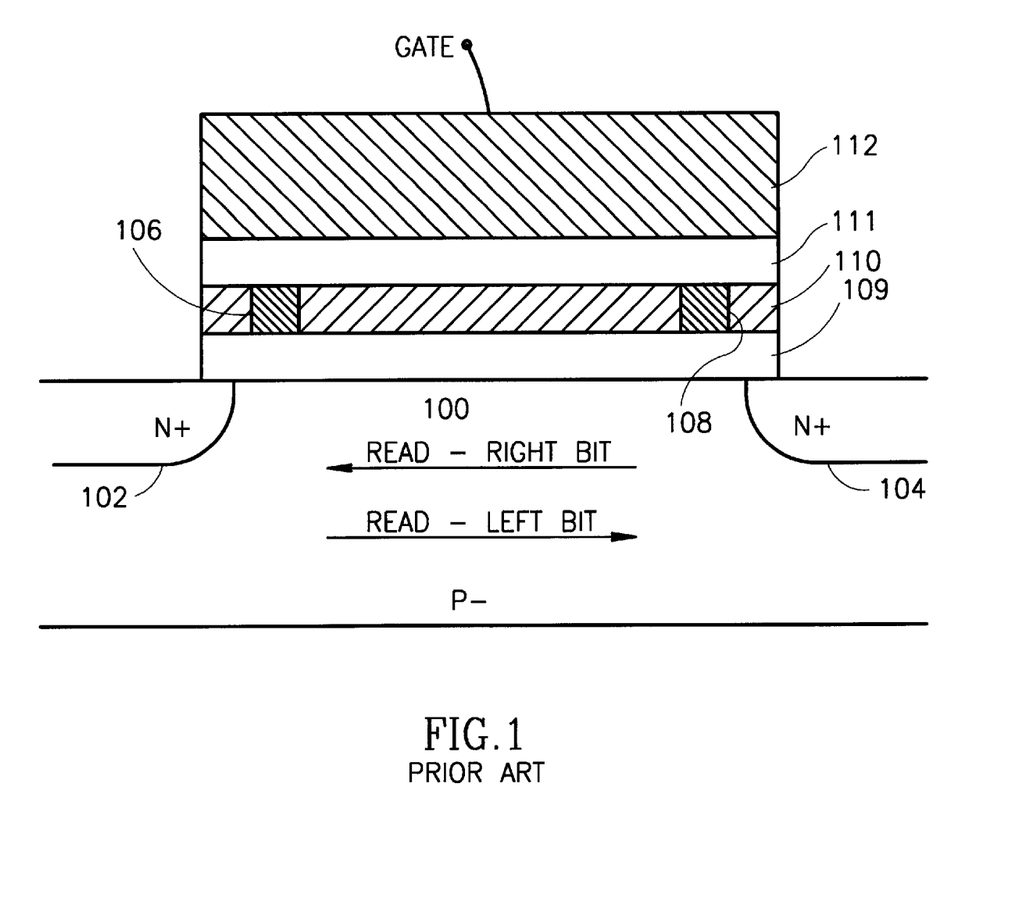
FIG. 1 is a schematic illustration of a dual bit NROM cell.

FIG. 1, to which reference is now made, schematically illustrates the dual bit NROM cell. The cell has a single channel 100 between two bit lines 102 and 104 but two separated and separately chargeable areas 106 and 108. Each area defines one bit. For the dual bit cell of FIG. 1, the separately chargeable areas 106 and 108 are found within a nitride layer 110 formed in an oxide-nitride-oxide sandwich (layers 109, 110 and 111) underneath a polysilicon layer 112.

To read the left bit, stored in area 106, right bit line 104 is the drain and left bit line 102 is the source. This is known as the "read through" direction. The cell is designed to ensure that, in this situation, only the charge in area 106 will affect the current in channel 100. To read the right bit, stored in area 108, the cell is read in the opposite direction. Thus, left bit line 102 is the drain and right bit line 104 is the source.

Like floating gate cells, the cell of FIG. 1 is erasable and programmable. Thus, the charge stored in areas 106 and 108 can change over time in response to a user's request.

SUMMARY OF THE INVENTION

An object of the present invention is to provide a dual bit, mask programmable array, such as the read only memory (ROM) type whose data is fixedly stored therein.

In accordance with a preferred embodiment of the present invention, each cell is a dual bit cell. The bits are separately stored in two different portions of the channel, where a programmed bit has a threshold pocket implant in the relevant portion of the channel. For example, the portions might be the left and right bit line junctions of the channel, where a programmed bit has a threshold pocket implant self-aligned to its bit line junction and an unprogrammed bit has no such implant.

In accordance with a preferred embodiment of the present invention, the array is manufactured by laying down a bit line mask and then implanting the bit lines in the spaces between the masks. The bit line mask can be formed from ultraviolet hardened photoresist or from a thick oxide layer.

The left and right bits are then separately created. For each type of bit, the bit line junctions which are to remain unprogrammed are first covered, with a junction mask. To program the channels whose left or right bit lines are uncovered, the array is exposed to a threshold pocket implant at a 15–45° angle to the right or to the left, respectively, which accesses the left or right bit line junction of the channels through the uncovered bit lines. This provides a self-aligned pocket implant (i.e. a programmed bit) in the bit line junctions of channels whose left or right bit lines, respectively, are exposed. The other exposed junctions are not implanted due to shadowing from the bit line mask.

The junction mask is removed and the other set of bits produced in a similar manner, except that the angle of the threshold pocket implant is in the opposite direction. The bit line mask is removed and a gate oxide layer is grown or deposited over the array. If the gate oxide layer is grown, then the oxide over the bit line is thicker than that over the gate due to the presence of implant in the bit line. The gates of all of the transistors of the chip and the word lines connecting them are then deposited. The chip is then finished according to the standard CMOS process.

For processes which grow a very thin gate oxide layer (less than 150 Å), an extra gate oxide cycle can be utilized which grows a thicker gate oxide the ROM portion of the chip. The thicker gate oxide layer reduces the amount of Boron needed to raise the threshold levels of the transistors so as to turn them off.

In an alternative embodiment of the present invention, the bit line implant occurs after the threshold voltage (i.e. programming) implant operations.

In a further alternative embodiment of the present invention, the pocket implant can be produced with two different materials, such as Boron and Arsenic or Phosphorous.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 2:
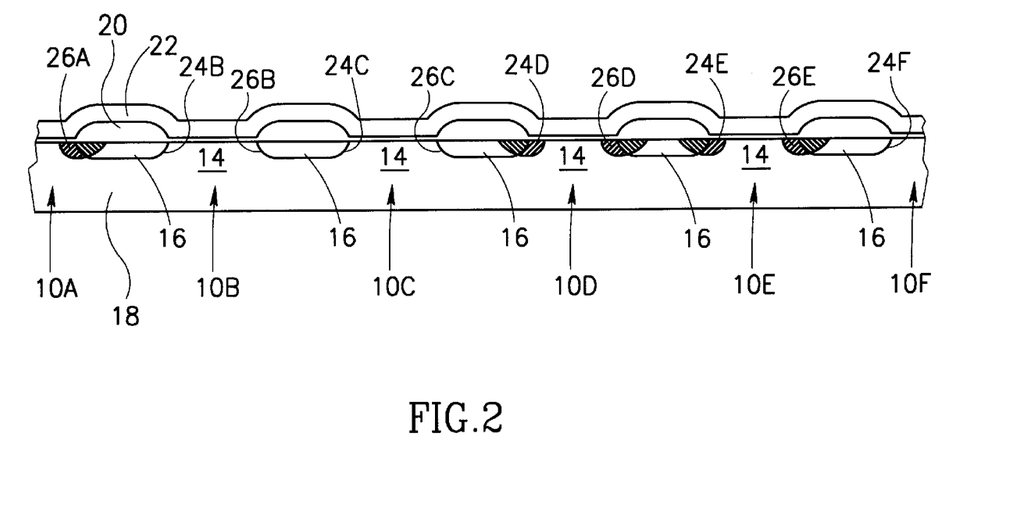
FIG. 2 is a schematic, cross-sectional illustration of a row of a dual bit, mask programmable array, constructed and operation in accordance with a preferred embodiment of the present invention.

Reference is now made to FIG. 2 which illustrates a cross-section of a mask programmable, dual bit array, constructed and operative in accordance with a preferred embodiment of the present invention. FIG. 2 marks each cell with the reference numeral 10 and shows four full cells and two partial cells. The cells are labeled A–F.

The array of the present invention is formed in a virtual ground architecture where each cell comprises a channel 14 formed between two diffusion bit lines 16 on a substrate 18. Neighboring cells share bit lines as is standard in virtual ground architectures. The substrate is covered with a gate oxide layer 20 which, if the oxide layer is grown, is thin above each channel 14 and is much thicker above each bit line 16. If the oxide layer is deposited, then it is relatively uniform in thickness. Rows 22 of polysilicon gates and word lines cover the gate oxide layer 20.

Each cell 10 is a dual bit cell whose left and right junctions 24 and 26, respectively, of the bit lines 16 with the channels 14 (e.g. "bit line junctions") are separately programmable. When a bit is programmed, the edge of the channel 14 near the associated bit line junction is implanted with a threshold pocket implant. For unprogrammed bits, there is no implant and the threshold level of the junction remains the same as in the channel 14.

FIG. 2 indicates a programmed bit with hashing and does not indicate an unprogrammed bit. Thus, in FIG. 2, only bit line junctions 26A, 24D, 26D, 24E and 26E are programmed.

In the prior art of ROM arrays, each programmed cell has a single threshold level throughout its channel. In the present invention, however, the threshold level is implanted, if at all, only in the bit line junctions 24 and 26 of the channel.

Figure 3A:
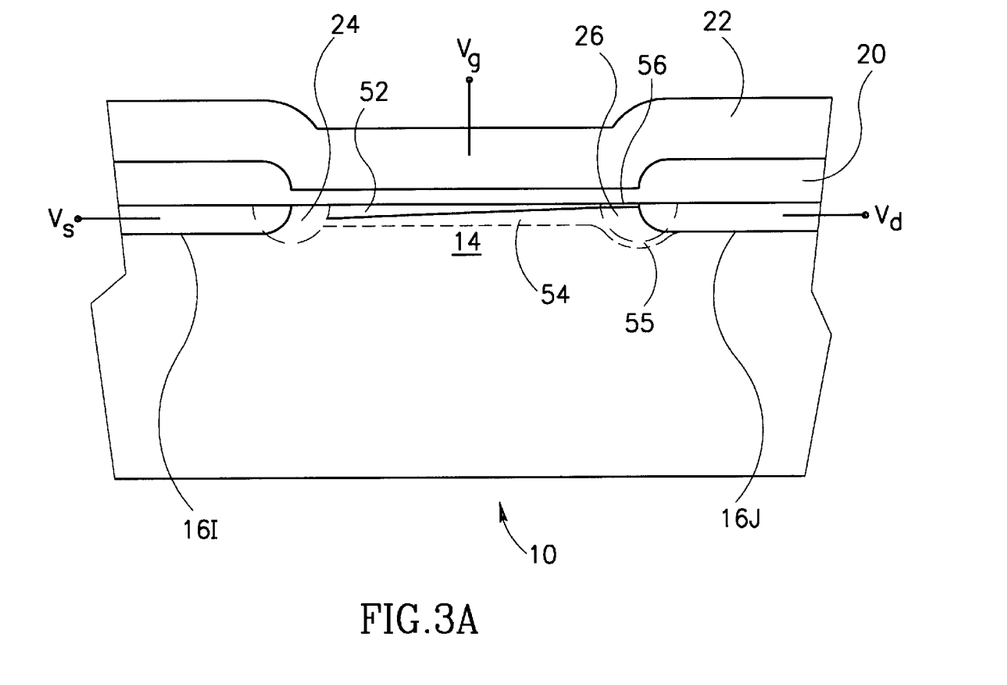
FIG. 3A is a schematic illustration of one cell in the row of FIG. 2.
Figure 3B:
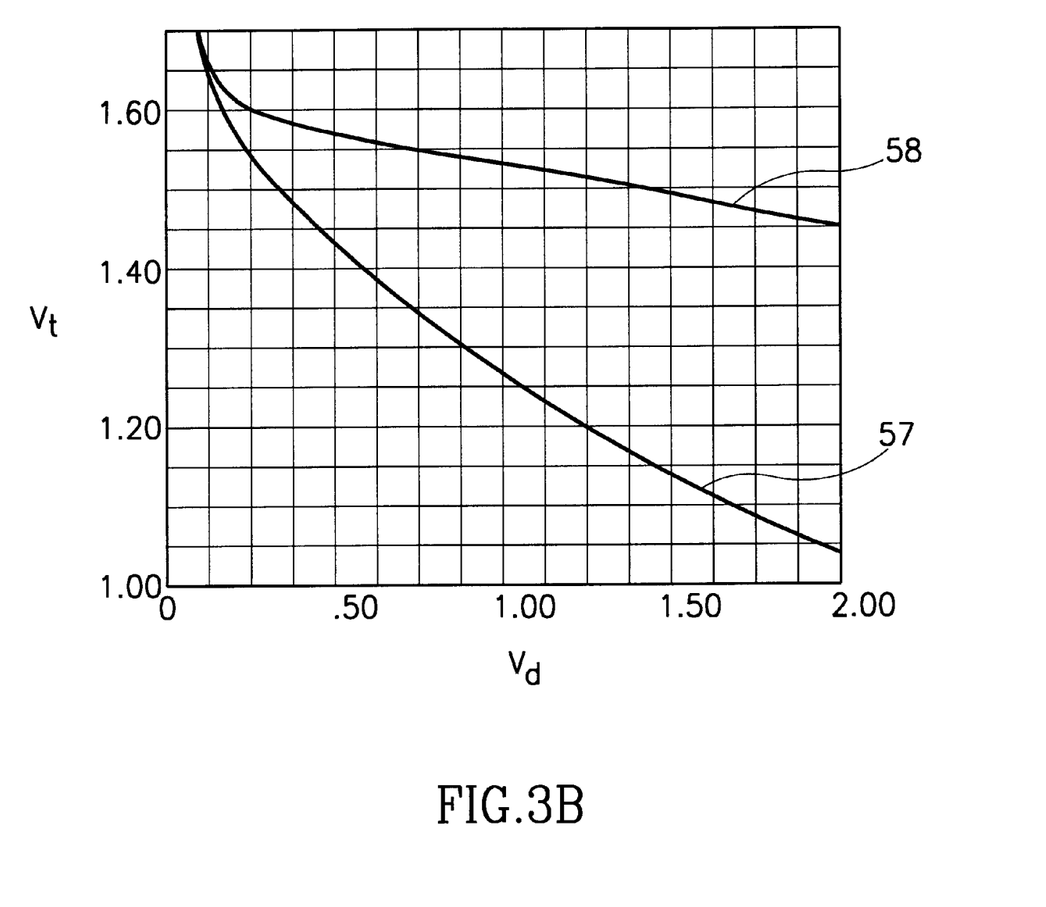
FIG. 3B is a graphical illustration of threshold voltage versus drain voltage for the cell of FIG. 3.

FIGS. 3A and 3B, to which reference is now briefly made, are useful in understanding the operation of the present invention. FIG. 3A illustrates a single cell 10 and FIG. 3B graphs threshold voltage level vs. drain voltage level.

In FIG. 3A, the channel 14, bit line junctions 24 and 26 and bit lines 16 are shown. For ease of discussion, the bit lines are labeled 16I and 16J. To read the left bit in left bit line junction 24, the left bit line 16I receives the source voltage level $V_s$, typically of 0V, and the right bit line 16J receives the drain voltage $V_d$, typically of 2V. The gate receives a relatively low voltage $V_g$, which typically is a low voltage of 3V.

The presence of the gate and drain voltages $V_g$ and $V_d$, respectively, induce a depletion layer 54 and an inversion layer 52 in the center of channel 10. The drain voltage $V_d$ is large enough to induce a depletion region 55 near drain 16J which extends to the depletion layer 54 of channel 10. This is known as "barrier lowering" and it causes "punch-through" of electrons from the inversion layer 52 to the drain 16J. The punch-through current is only minimally controlled by the implant in right junction 26 and thus, the left bit can be read irrespective of the presence or absence of implant in right junction 26.

Since junction 24 is near left bit line 16I which, for this case, acts as the source (i.e. low voltage level), the implant state of junction 24 will determine whether or not the inversion layer 52 is extended to the source 16I. If left junction 24 has a threshold implant, then the voltage thereacross will not be sufficient to extend inversion layer 52 to the source 16I and a "0" will be read. The opposite is true if left junction 24 has no threshold implant.

This is illustrated in FIG. 3B which graphs threshold voltage $V_t$ vs. drain voltage $V_d$. Two graphs 57 and 58 are shown which respectively indicate the threshold voltage for a non-programmed bit (a "1") and for a programmed bit (a "0"). At high drain voltages $V_d$, the threshold voltages become significantly separated.

To read the right bit, stored in right bit line junction 26, the cell is read in the opposite direction. In this case, right bit line 16J is the source and left bit line 16I is the drain.

Figure 4A:
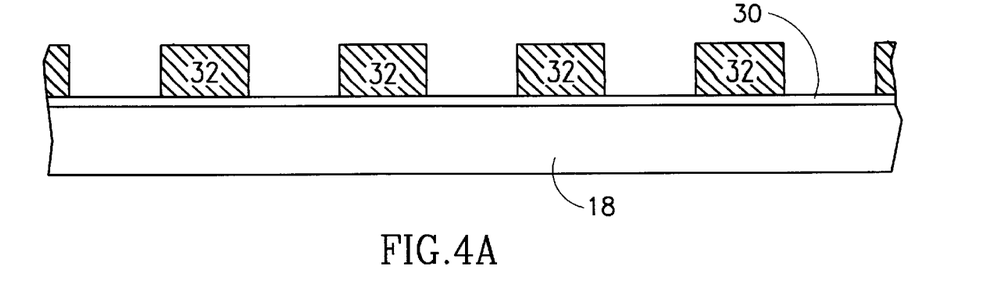
FIGS. 4A, 4B, 4C, 4D, 4E, 4F, 4G and 4H are cross-sectional illustrations of the state of the row of FIG. 2 during various stages of manufacture.
Figure 4B:
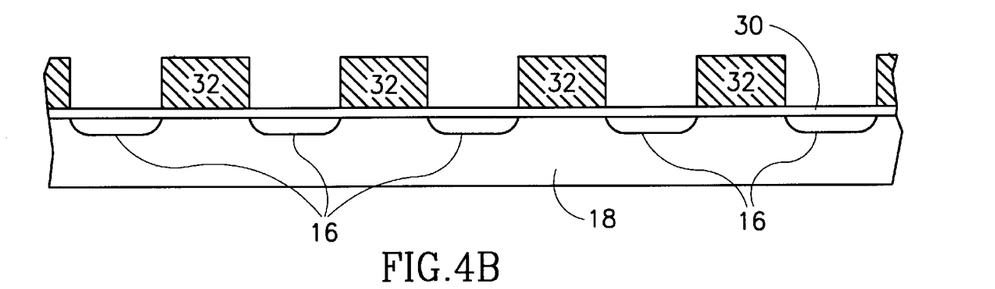
Figure 4C:
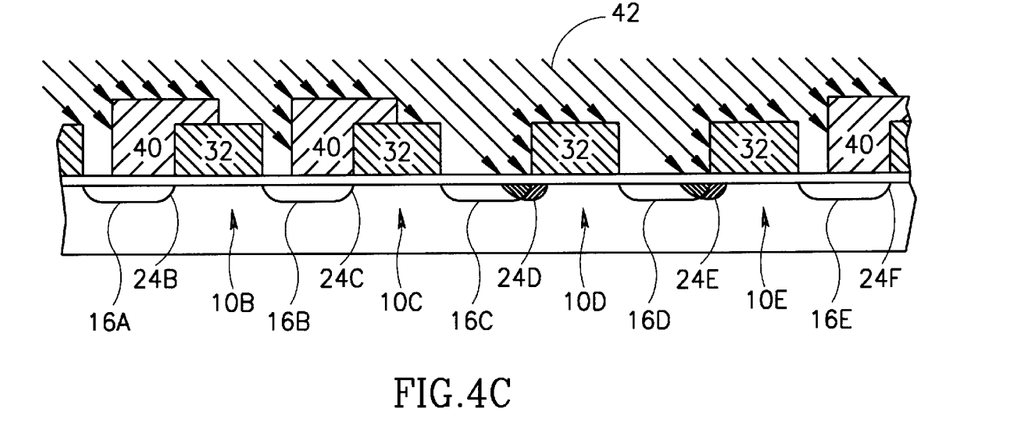
Figure 4D:
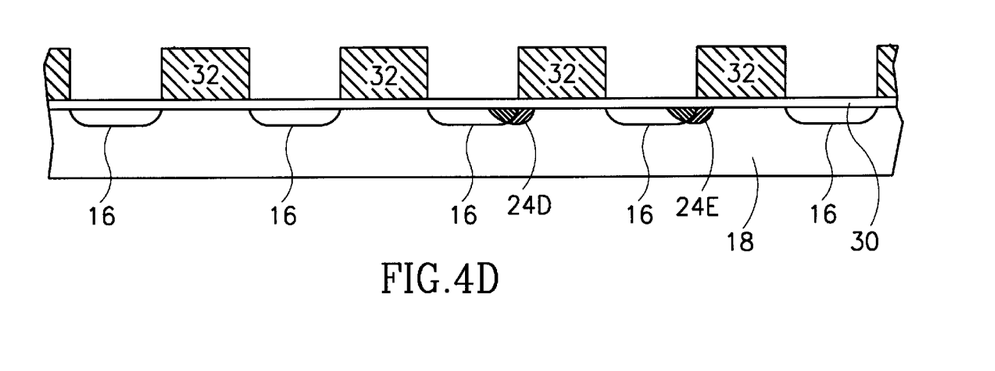
Figure 4E:
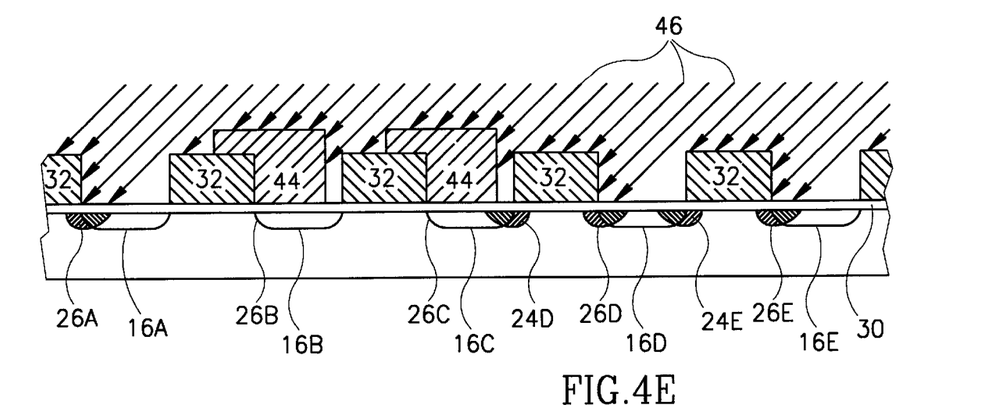
Figure 4F:
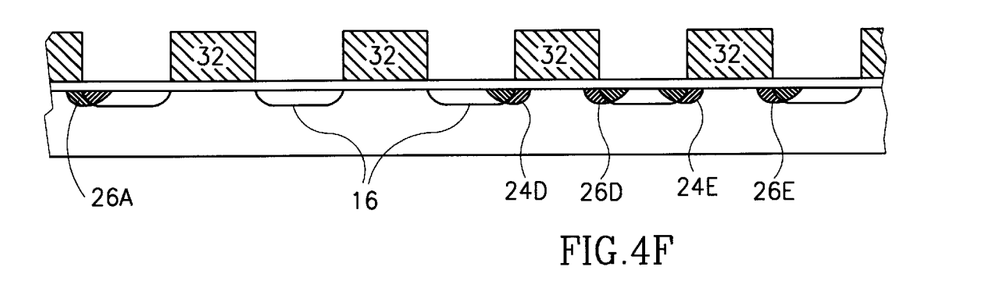
Figure 4G:
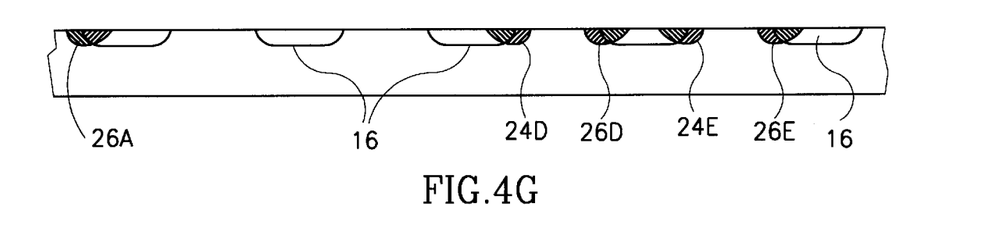
Figure 4H:
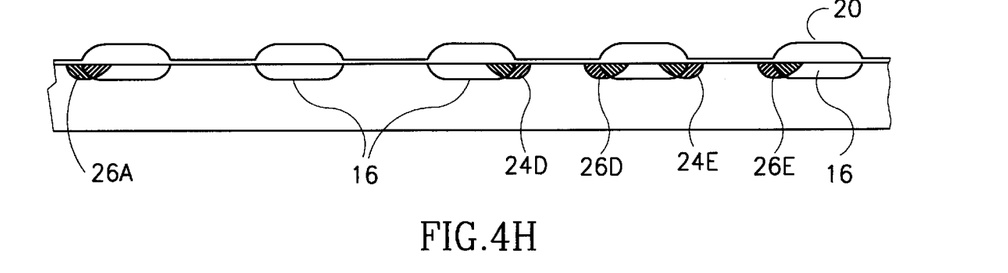
Figure 5A:
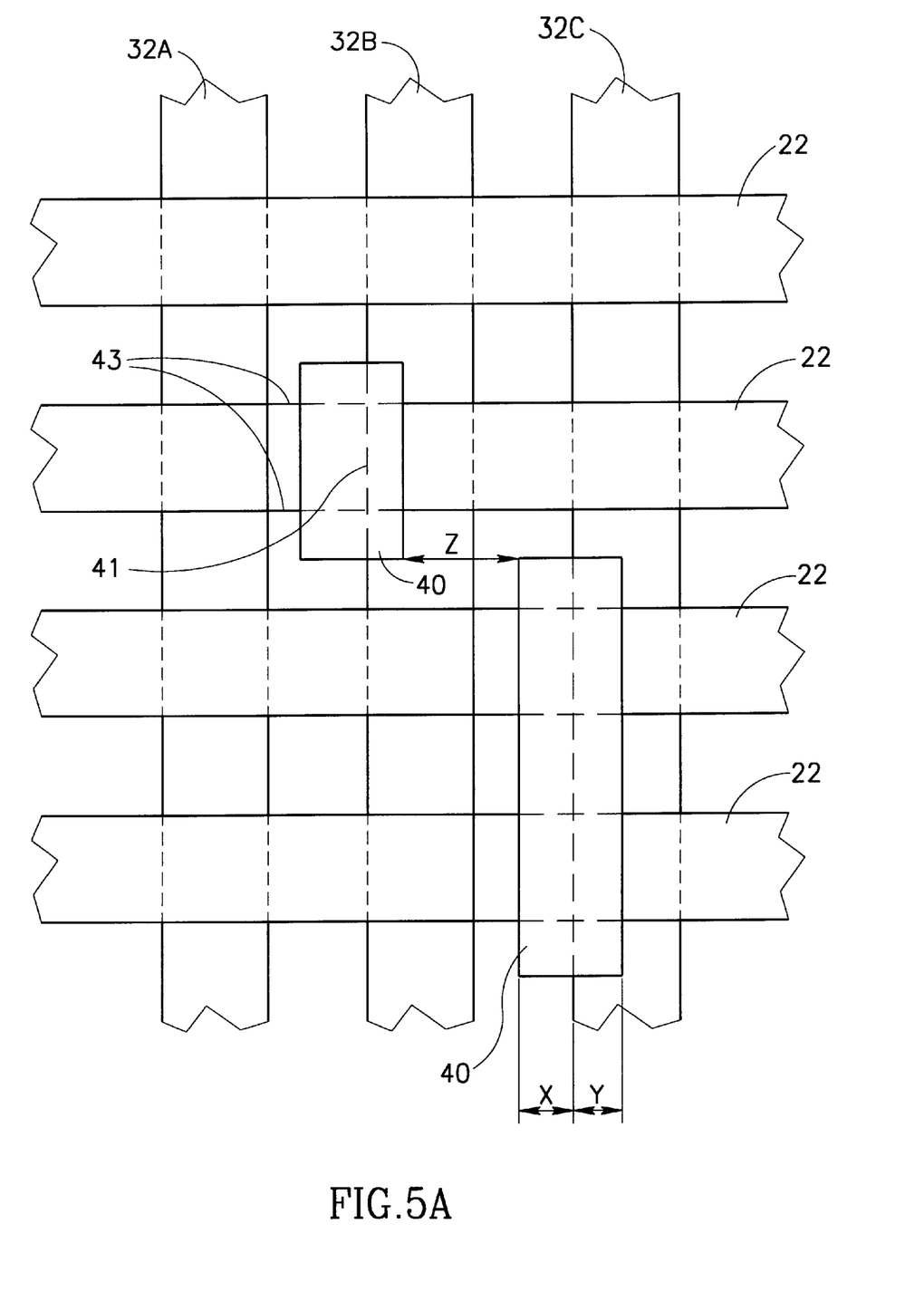
FIGS. 5A and 5B are layout illustrations of the locations of junction mask elements on the grid of the array for the implantations shown in FIGS. 4C and 4E, respectively.
Figure 5B:
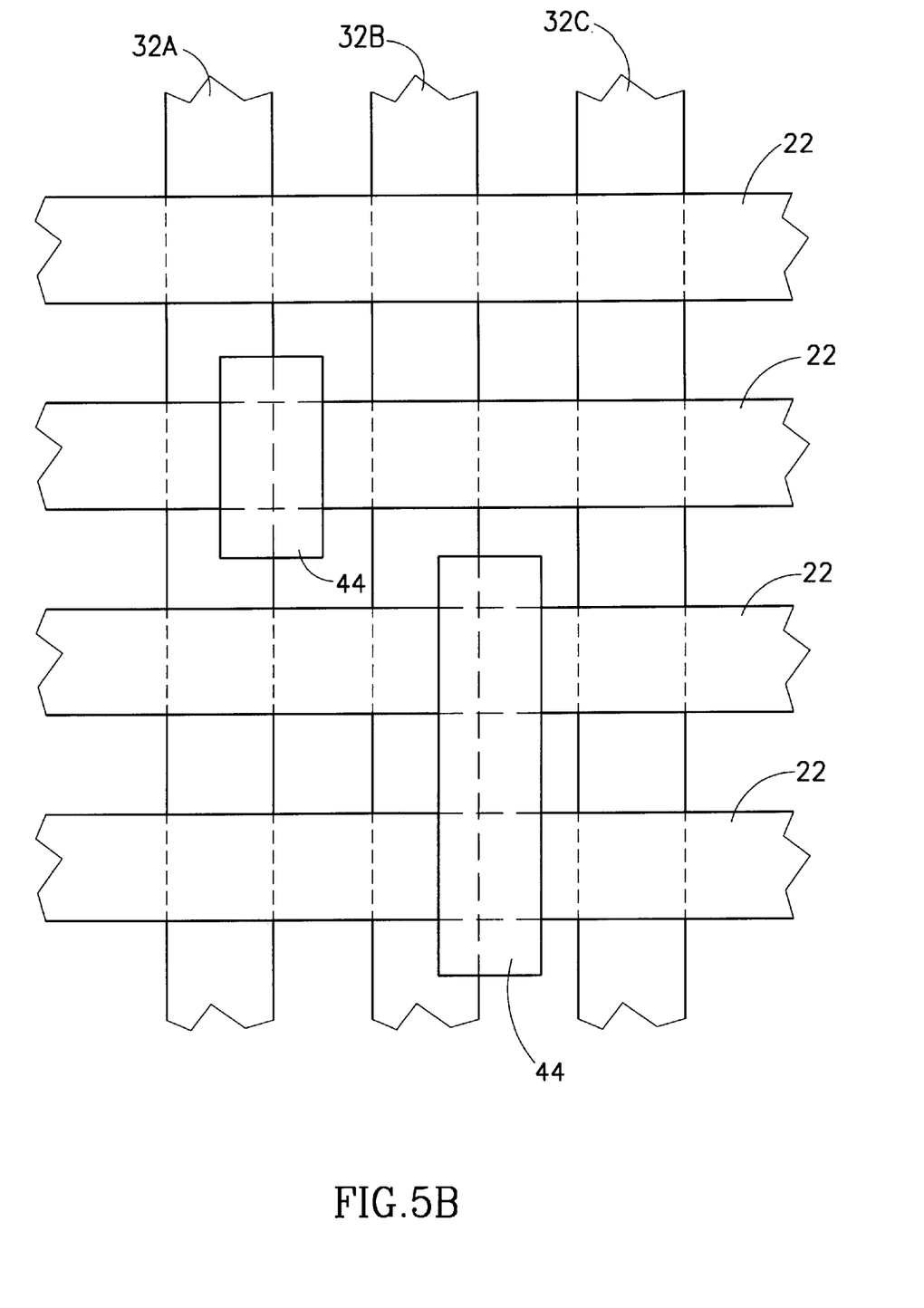
Figure 6:
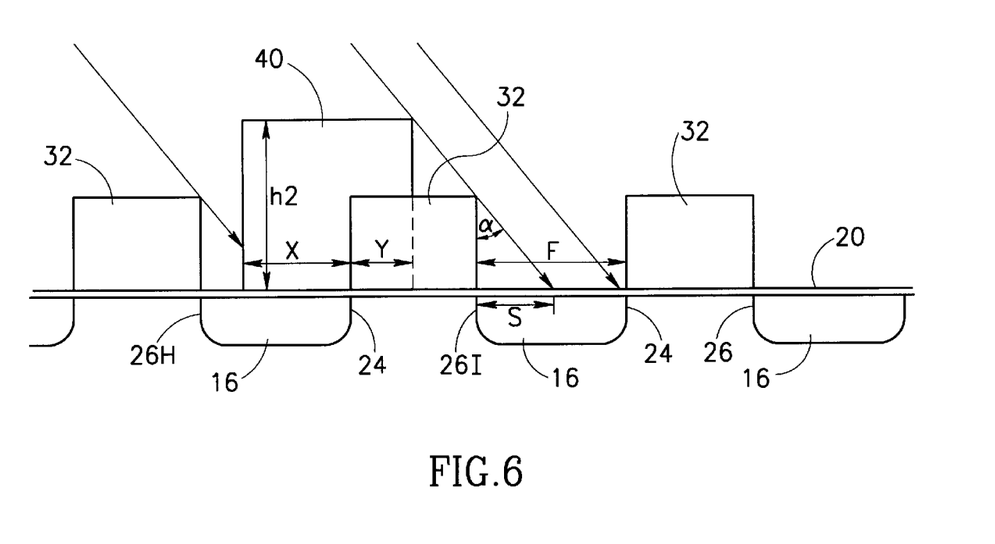
FIG. 6 is an enlarged illustration of the operation shown in FIG. 4C useful in understanding the criteria determining the sizes of the bit line and junction masks.

Reference is now made to FIGS. 4A, 4B, 4C, 4D, 4E, 4F, 4G, 4H, 5A, 5B and 6 which are useful in understanding the manufacture of the mask programmable array of the present invention. FIGS. 4A–4H are cross-sections of the row of FIG. 2 at different steps of its manufacture. FIGS. 5A and 5B are top views of the masks formed on the array which are useful in understanding the operation described with respect to FIGS. 4C and 4E. FIG. 6 is useful in understanding the relative sizing of the masks used.

Initially, and as shown in FIG. 4A, a sacrificial oxide layer 30 is grown on top of the substrate 18. The sacrificial oxide layer 30 can be any suitable thickness, such as 200 Å.

A bit line mask is laid down next. The mask is formed of columns 32 laid over the locations of the future channels. The bit lines are to be implanted between the columns 32 and are thus, self-aligned to the future channels. The bit line mask can be formed of a hardened photoresist or of a thick oxide.

In accordance with a preferred embodiment of the present invention, the bit line mask 32 is a layer of photoresist hardened with ultraviolet (UV) after being laid down. This makes a hard mask which is not removable using the standard photoresist removal solvents.

An alternative bit line mask 32 can be formed of a thick oxide layer, of a minimal thickness of 1000 Å. Such a mask is formed by first depositing a thick oxide layer, typically utilizing the low pressure, chemical vapor deposit (LPCVD) process. A layer of photoresist is then deposited in the desired column pattern after which the oxide found between the photoresist columns is etched away, typically using a dry etch process. The photoresist layer is removed and the thick oxide, bit line mask 32 remains. The thick oxide mask cannot be removed during standard, solvent, photoresist removal techniques.

As shown in FIG. 4B, the bit lines 16 are implanted between the columns 32 of the bit line mask. Typically, the implant operation is 45 Kev of Arsenic, up to a dose of $2$–$4 \times 10^{15}$ per $cm^2$. Other implants and dosage levels are also contemplated and are within the scope of the present invention.

At this point, the right and left bits of each cell are separately programmed. For each type of bit, the same operation occurs. A junction mask is placed down covering the bit line junctions 24 or 26 which are to remain unprogrammed. A threshold pocket implant is provided at an angle to the vertical, thereby implanting, in a self-aligned manner, into the selected bit line junctions as well as into part of the open bit lines near the selected bit line junctions. The junction mask is then removed, leaving the bit line mask 32, and the process is repeated for the other bit.

FIG. 4C shows the operation for left bit line junctions 24 of the row of FIG. 2. Only bit line junctions 24D and 24E are to be programmed with the angled threshold implant. Thus, the bit lines, labeled 16C and 16D of left bit line junctions 24D and 24E, respectively, are not covered with a mask. However, the areas around the bit line junctions 24 which are to remain unprogrammed, i.e. bit lines 16A, 16B, 16E and 16F of bit line junctions 24B, 24C, 24F and 24G, respectively, are covered with junction mask elements, labeled 40.

As described in more detail hereinbelow, the junction mask typically covers part of the bit line and part of the channel which abut at the junction. FIG. 4C shows junction mask 40 in side view and FIG. 5A shows it in top view. Both figures also show the bit line mask 32 and FIG. 5A also indicates the word line/transistor gate layer 22.

FIG. 5A indicates that the junction mask 40 covers the junction area, marked 41, along a column of the bit line mask 32 to both sides 43 of word line layer 22. FIG. 5A also indicates that, if the same bit in two neighboring rows is to be left unprogrammed, the junction mask 40 covers them both in a single unit, rather than creating two separate units. The distance Z between junction mask elements on neighboring columns 32B and 32C is limited only by the minimum feature size. Finally, it is noted that junction mask elements 40 are located on the left side of bit line mask columns 32B and 32C.

FIG. 4C indicates the threshold implant with arrows 42. The implant can be any suitable threshold pocket implant, such as Boron at 30–120 Kev up to a dose of $1-5\times10^{13}$ per $cm^2$. The implant is at an angle of 15–45° to the right of vertical. Since the bit line mask 32 covers the channels of all cells and the junction mask elements 40 cover all the left bit line junctions which are to remain unprogrammed, the implant has access only to the left bit line junctions which are to be programmed. The implant is to the right of the vertical since the left bit line junctions are on the right of the open bit lines (which is to the left of the neighboring channel). As indicated by the arrows 42, the angled implant accesses the left bit line junction and a portion of the open bit lines to the left of the junction. The implant is, thus, self-aligned to the left bit line junctions 24 of the channels which are to be programmed.

The implant dosage must be high enough to ensure sufficient implantation into the channel portion of the bit line junction such that, some implant remains even if the bit line later diffuses into the channel. The implant which reaches the rightmost portion of the bit line has no effect on the function of the cell; instead, the implant adds to the bit line implant dosage. Since the threshold implant dosage is two orders of magnitude lower than the bit line implant dosage, it does not affect the dosage within the bit line.

FIG. 6 illustrates the relationships among the bit line mask 32 and the junction mask which affect the location of the implant and shows only three transistors 10. For this example, the bit line mask 32 shadows the right junction, labeled 26I, on the other side of the open bit line 16I, which is not to receive an implant.

The choice of angle is typically based on the desired threshold level for the programmed bits and is 15–45°.

The thickness of the bit line mask 32 affects the amount of shadowing and is a function of the angle of the implant, as follows:

Let S be the amount of the bit line 16, from the bit line mask 32, to be shadowed, let h1 be the thickness of the bit line mask 32 and let α be the angle from the vertical of the implant, then:

$$S = h1 * \tan \alpha$$

For example, if the desired shadowing S is 800 Å and the angle α is 20°, then the thickness h1 is 2197 Å.

The overlap Y has to guarantee that, with all possible process misalignments to the left, no implant can reach the left junction 24 which is being protected, or:

$$Y > MA - h2 * \tan \alpha$$

where h2 is the height of the junction mask 40 and MA is the maximum misalignment.

The width X by which the junction mask 40 extends over the bit line 16 must ensure that there is no implantation into the right bit line 26H even assuming a misalignment to the right. If the junction mask 40 is properly aligned, the width X is defined by:

$$X < 2F - MA$$

where F is the distance between neighboring bit line mask elements 32.

If the junction mask 40 is misaligned to the right, then the widths X and Y are defined by:

$$X > MA + IL + IS - BLJ$$

$$Y < 2F - MA - h2 * \tan \alpha$$

where IL is the lateral width of the angled pocket implant, IS is the amount of side diffusion of the pocket implant and BLJ is the amount of side diffusion of the bit line junction.

The above equations define the requirements for the width and height of the junction mask 40 and the height of the bit line mask 32.

Returning to FIG. 4, once the threshold pocket implant has been implanted, the junction mask elements 40 are removed, typically via standard photoresist etching techniques. As shown in FIG. 4D, the bit line mask columns 32 remain.

FIG. 4E illustrates the threshold implant operation for the right bit line junctions 26. The junction mask elements, here labeled 44, are to be placed over the right bit line junctions which are to remain unprogrammed. In FIG. 2, right bit line junctions 26A, 26D and 26E are to be programmed. Thus, junction mask elements 44 are found over bit line junctions 26B and 26C. The implant, labeled by arrows 46, is at the same angle as before; however, for the right bit line junctions 26, the implant angle is to the left of vertical.

FIG. 4F indicates the state of the row once junction mask elements 44 are removed, typically according to the same process as used for removing junction mask elements 40. FIG. 4F shows that only bit line junctions 26A, 24D, 26D; 24E and 26E are programmed and that bit line mask columns 32 remain.

It will be appreciated that the bit line mask 32 is both a bit line mask and part of the threshold pocket implant mask. Thus, the bit line implant can occur before the pocket implants, as shown, or afterwards. It will further be appreciated that the order for implanting the pocket implant into the right and left bit line junctions is not significant nor does it affect the self-alignment of the implants to bit line junctions.

Once all of the relevant bit line junctions have been programmed, the bit line mask 32 is removed. For UV hardened photoresist, this process involves a plasma removal process of the top photoresist layer followed by standard solvent photoresist removal techniques. If the bit line mask 32 is formed of a thick oxide layer, it is removed with a standard wet etch.

Following removal of all of the photoresist elements, the sacrificial oxide layer 30 is removed using a wet etch. The result is shown in FIG. 4G. Within substrate 18 are the bit lines 16 and those bit line junctions 26A, 24D, 26D, 24E and 26E which are programmed. If the bit line mask 32 is formed of a thick oxide layer, the sacrificial oxide layer 30 is removed together with the bit line mask.

The memory array is now finished in accordance with standard CMOS (complementary, metal-oxide semiconductor) process techniques. The two steps of interest are the gate oxide growth step and the polysilicon word line deposition.

The gate oxide layer 20 is now grown over the entire array using standard techniques. For a 0.5 μm process, the gate oxide layer 20 might be grown to a thickness of 120 Å over the channels 14 while for a 0.35 μm process, the gate oxide layer 20 might be grown to a thickness of 80 Å. Alternatively, the gate oxide layer 20 can be deposited in a chemical vapor deposition operation.

As noted hereinabove and as shown in FIG. 4H, when the gate oxide is grown, the gate oxide layer 20 is 2–3 times thicker over the bit lines 16 due to the presence therein of the bit line implant material. If the gate oxide is deposited, this is not true.

If desired, two gate oxide layers can be laid down, as described in U.S. Pat. No. 5,683,925 and entitled "Manufacturing Method for ROM Array with Minimal Band-to-Band Tunneling" whose disclosure is incorporated herein by reference. This manufacturing method involves providing an oxide layer on the entire chip, removing the oxide layer from the periphery and providing a second oxide layer over the entire chip. This provides two different gate oxide thicknesses to the periphery and the array areas, where the gate oxide in the array is thicker than that of the periphery.

It is noted that the oxidation step occurs after the bit lines have been implanted. If the oxide is grown, the bit lines might diffuse outwardly for lack of an oxide cap. This can contaminate the CMOS area of the chip. In accordance with a preferred embodiment of the present invention, the oxide growth step provides a small amount of oxygen to the oven while slowly ramping the temperature therein, thereby capping the chip with a thin layer of oxide. The ramp typically begins at 700° C. Once the desired temperature is reached, the full amount of oxide should be placed in the oven.

The final step is the deposition of the polysilicon gates and word lines 22, in accordance with standard deposition techniques. The result is the row shown in FIG. 2.

The standard CMOS backend continues at this point without any special mask to protect the array.

It will be appreciated that the present invention adds three masks to a standard CMOS manufacturing sequence. The masks are, in order, the bit line mask and the two separate junction masks.

It is noted that, with thin gate oxides, of less than 150 Å, the threshold implant dosage is quite high, on the order of $5 \times 10^{13}$. Unfortunately, implants of such high dosages tend to spread out in the channel and this reduces the cell's ability to punchthrough to the drain when reading the bit near the source.

To optimize the punchthrough of the implanted region, two different materials, such as Boron and either Arsenic or Phosphorous, can be implanted into the junctions. Since Boron creates holes and Arsenic and Phosphorous create free electrons, the final concentration of holes and electrons is a function of the combined concentration of the two materials.

Figure 7:
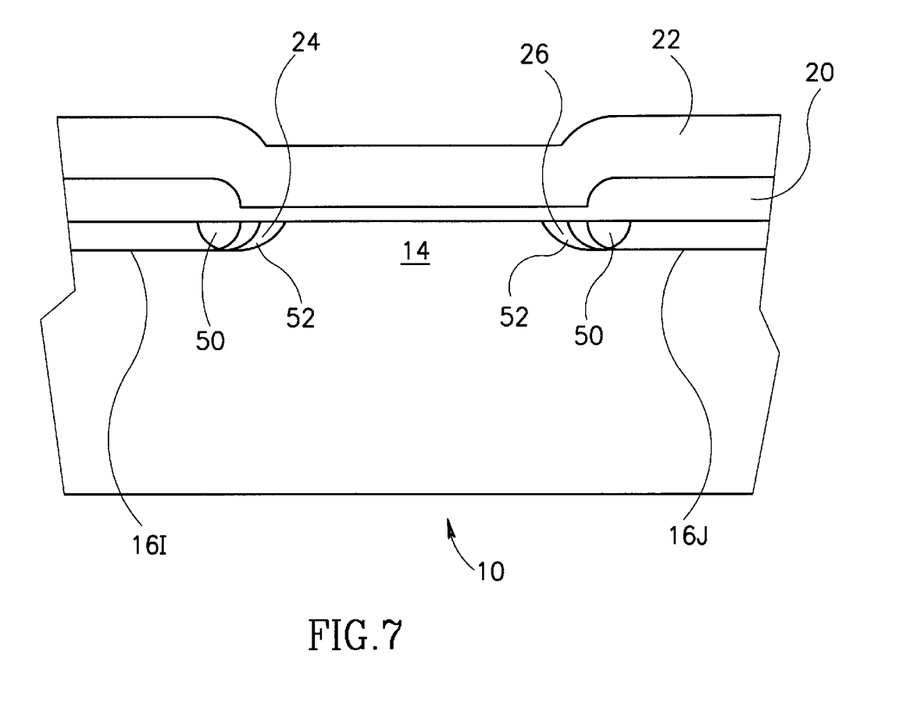
FIG. 7 is a schematic illustration of one cell in the row of FIG. 2 with a double implant.
Figure 8:
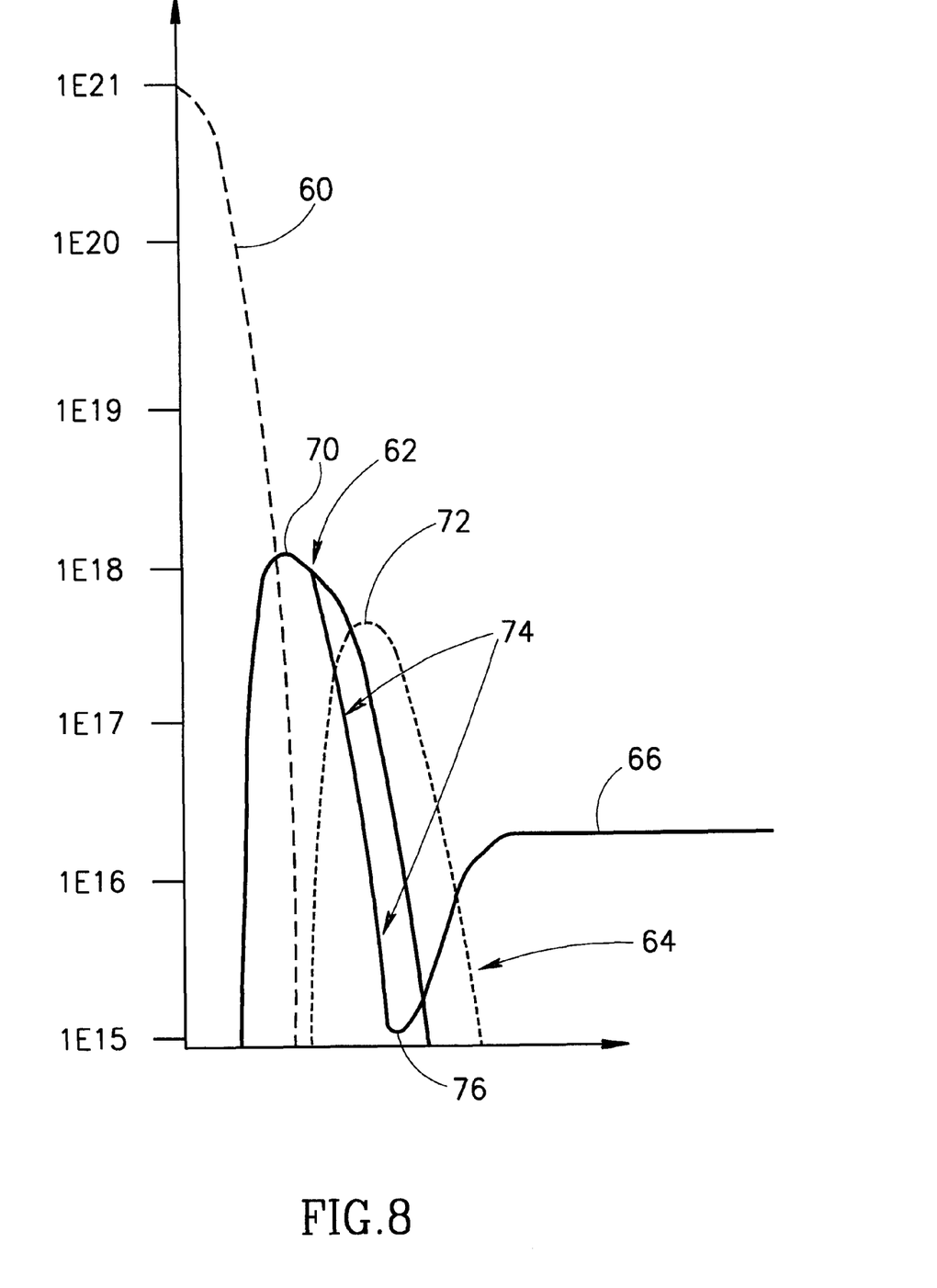
FIG. 8 is a graphical illustration of the implant profile useful in understanding the cell of FIG. 7.

The alternative embodiment is shown in FIG. 7, to which reference is now briefly made, which is similar to FIG. 3 and uses similar reference numerals. Reference is also made to FIG. 8 which illustrates the implant profile for this embodiment.

Each bit line junction 24 or 26 is implanted with two implant materials 50 and 52 which together shape the area where the implant has its effect. The first implant 50, which is typically of Boron, is designed to have a maximum concentration near the bit line 16 while the second implant 52, which is typically of Arsenic or Phosphorous, is designed to have a maximum concentration away from the bit line 16.

Together, the two implants provide the desired high implant dosage to give the desired threshold level. However, the second implant is used to shape the area where the first implant will have its effect so that it is effective only close to the bit line junction. This is shown in FIG. 8 which is a graph of the implant concentration profile versus the location along the channel 10 when the left bit line is the drain.

Curve 60 indicates the concentration of the bit line 16, curve 62 indicates the concentration of the Boron implant 50, curve 64 indicates the concentration of the Phosphorous implant 52 and line 66 indicates the concentration of the Boron in the remainder of the channel. As can be seen, curve 60 (the bit line 16) has a significantly higher concentration than that of either the Boron or the Phosphorous. The Boron (curve 62) has a maximal concentration, labeled 70, near the bit line junction and the Phosphorous (curve 64) has a maximal concentration, labeled 72, further into the channel.

Curve 74 indicates the effective concentration of holes. It has a maximum at point 70 but, due to the presence of the Phosphorous, it has a significant minimum at a point 76 slightly to the right of the maximum point 72 of the Phosphorous. The minimum concentration level is at least three orders of magnitude less than the maximum concentration 70 of the Boron implant. Past the Phosphorous implant, the effective hole concentration level returns to the background Boron level in the channel.

As indicated by FIG. 8, the double implant provides a high threshold level close to the drain with a sharp drop-off thereafter. The thin effective threshold area enables punch-through when reading the 'other' bit and a high threshold level when reading 'this' bit.

It is noted that the dose, energy and tilt (or angle) levels for the two implants can be separately determined based on the desired shape of the lateral channel field. For example, the Boron implant can be of 45 Kev at 20° and the Phosphorous implant can be of 60 Kev at 25°.

It will be appreciated that the memory array includes other elements other than just the dual bit cells. Typically, the cells are organized into blocks which are separately accessed by select transistors formed in a select area. The select transistors are isolated from each other. In standard architectures, the isolation is provided by field oxide elements between active select transistors. Such a structure is described in the U.S. Patent Application entitled "A Symmetric Segmented Memory Array Architecture", filed Dec. 12, 1997 and assigned to the common assignee of the present invention, whose disclosure is incorporated herein by reference.

The field oxide elements are actually formed within an "isolation" transistor, where the field oxide elements replace the thin gate oxide of an active transistor. In accordance with a preferred embodiment of the present invention, the isolation transistors can be regular, thin oxide, transistors which are "shut off", i.e. programmed, during the mask programming process. For these transistors, both bits are implanted in order to completely shut off the transistor.

It will be appreciated by persons skilled in the art that the present invention is not limited by what has been particularly shown and described herein above. Rather the scope of the invention is defined by the claims that follow:

What is claimed is:

1. A method of manufacturing a mask programmable array having a multiplicity of dual bit cells, wherein each cell has a channel and two bit storage areas self-aligned to the junctions of the channel and bit lines, and the two bits are read in opposite directions, the method comprising the steps of:

depositing a bit line mask on a substrate in columns, said columns defining said channels thereunder and diffusion bit lines therebetween, each of said channels having a left and a right bit line junction with its neighboring said diffusion bit lines;

separately programming the bit storage areas at said left and right bit line junctions; and removing said bit line mask, wherein each step of programming includes the steps of:
depositing a junction mask over all bit line junctions which are to remain unprogrammed;
implanting a self-aligned threshold pocket implant at an angle of 15–45° from vertical on said array, wherein said angle is to the right when programming said left bit line junctions and to the left when programming said right bit line junctions; and
removing said junction mask.

2. A method according to claim 1 and wherein said bit line mask is a formed of ultraviolet hardened photoresist.

3. A method according to claim 1 and wherein said bit line mask is formed of thick oxide.

4. A method according to claim 1 and also comprising the step of implanting said bit lines before said step of separately programming.

5. A method according to claim 1 and also comprising the step of implanting said bit lines after said step of separately programming.

6. A method according to claim 1 and also comprising, after said step of removing said bit line mask, the steps of creating a gate oxide layer on said array and depositing rows of polysilicon word lines over said gate oxide layer.

7. A method according to claim 1 and wherein said step of depositing a bit line mask comprises the steps of depositing a photoresist layer in the locations of the mask and hardening said photoresist layer by exposure to ultraviolet.

8. A method according to claim 1 and wherein said step of depositing a bit line mask comprises the steps of depositing a thick oxide layer, depositing a photoresist layer in the locations of the mask, etching the thick oxide layer which is found between elements of said photoresist layer, and removing said photoresist layer.

9. A method according to claim 1 and wherein said step of implanting comprises the steps of implanting a first material and implanting a second material, different than said first material.

10. A method according to claim 9 wherein said first material is Boron and said second material is one of the following: Arsenic and Phosphorous.

* * * * *